(12) United States Patent
Di et al.

(10) Patent No.: US 8,877,608 B2
(45) Date of Patent: Nov. 4, 2014

(54) METHOD FOR PREPARING GOI CHIP STRUCTURE

(71) Applicants:Zengfeng Di, Shanghai (CN); Lin Ye, Shanghai (CN); Zhongying Xue, Shanghai (CN); Miao Zhang, Shanghai (CN)

(72) Inventors: Zengfeng Di, Shanghai (CN); Lin Ye, Shanghai (CN); Zhongying Xue, Shanghai (CN); Miao Zhang, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 0 days.

(21) Appl. No.: 13/825,010

(22) PCT Filed: Sep. 25, 2012

(86) PCT No.: PCT/CN2012/081890
§ 371 (c)(1),
(2), (4) Date: Mar. 18, 2013

(87) PCT Pub. No.: WO2014/005379
PCT Pub. Date: Jan. 9, 2014

(65) Prior Publication Data
US 2014/0004684 A1    Jan. 2, 2014

(30) Foreign Application Priority Data
Jul. 2, 2012  (CN) .......................... 2012 1 0225637

(51) Int. Cl.
*H01L 21/46* (2006.01)
*H01L 21/762* (2006.01)

(52) U.S. Cl.
CPC .............................. *H01L 21/76254* (2013.01)
USPC ........................................................ 438/458

(58) Field of Classification Search
USPC .................................................. 438/455, 458
See application file for complete search history.

(56) References Cited

U.S. PATENT DOCUMENTS

| | | | |
|---|---|---|---|
| 2005/0070115 A1* | 3/2005 | Maa et al. ..................... | 438/706 |
| 2007/0287269 A1* | 12/2007 | Yokokawa et al. ........... | 438/478 |
| 2008/0138959 A1* | 6/2008 | Yokokawa et al. ........... | 438/458 |
| 2009/0170295 A1* | 7/2009 | Vincent et al. ................ | 438/507 |

* cited by examiner

*Primary Examiner* — Bradley K Smith
(74) *Attorney, Agent, or Firm* — Tianhua Gu; Global IP Service

(57) ABSTRACT

The present invention provides a method for preparing a GOI chip structure, where, in the method, first, a SiGe on insulator (SGOI) chip structure is made by using a SMART CUT technology, and then, germanium condensation technology is performed on the SGOI chip structure, so as to obtain a GOI chip structure. Because the SGOI made by the Smart-Cut technology basically has no misfit dislocation in an SGOI/BOX interface, the threading dislocation density of the GOI is finally reduced. A technique of the present invention is simple, the high-quality GOI chip structure can be implemented, and the germanium condensation technology is greatly improved. An ion implantation technology and an annealing technology are quite mature techniques in the current semiconductor industry, so that such a preparation method greatly improves the possibility of wide use of the germanium concentration technology in the semiconductor industry.

10 Claims, 2 Drawing Sheets

METHOD FOR PREPARING GOI CHIP STRUCTURE

BACKGROUND OF THE PRESENT INVENTION

1. Field of Invention

The present invention relates to a method for preparing a chip structure, specifically to a method for preparing a germanium-on-insulator (GOI) chip structure.

2. Description of Related Arts

With rapid development of silicon-based large scale integrated circuit technologies, performances of bulk silicon complementary metal-oxide-semiconductor (CMOS) devices are gradually approaching physical limits of silicon materials, and the further improving of the performances of the bulk silicon CMOS devices along a direction guided by Moore's Law will face growing investments and market risks. The semiconductor industry is a market quite sensitive to a ratio of quality to price of the product. How to constantly improve the performances of the silicon-based devices on the basis of an existing very large scale integration (VLSL) technique without a significant increase in investment has become a common problem in the industry. Exploration of new materials and new techniques is absolutely an important idea and research direction for solving the problem.

The GOI is the latest achievement in the development of the field of advanced silicon-based substrate materials, and it is of great importance for the high-performance CMOS integrated circuit (IC), the photodetector, and the solar cell. The GOI can be used as a photodetector GOI (the efficiency of absorbing light with a wavelength of 850 nm by germanium is 70 times of that of silicon), and can also be used to make a high-speed transistor. A conversion speed of a transistor based on germanium is 3 to 4 times higher than that of the silicon. Germanium metal is capable of improving electron mobility of a material, so that the germanium material has a good perspective for high-speed logic IC applications in the future. The GOI is used to manufacture a high-speed photodetector (running at 30 GHz), so that the high-speed photodetector is theoretically applicable to detection of a signal with a speed higher than 50 Gb/sec, and optical interconnection on a chip is much closer to the reality. The GOI technology can be compatible with a silicon CMOS technique. The germanium can be selectively placed in a region where the photodetector is located, so that the new detector is compatible with a standard microchip technology. The compatibility makes it possible to integrate an optoelectronic circuit on the same chip, such as a microprocessor and other electronic devices. Currently, the GOI technology is mainly focused in the following several fields: GOI high-speed CMOS device, high-frequency CMOS device, photodetector and solar cell. A few decades ago, people knew that the germanium had a speed advantage compared to the silicon; however, the instability of a germanium oxide layer makes it feasible to make a MOS device. Today, a new generation of a high-K dielectric deposition technology and these new GOI substrates endow device manufactured with more flexibility in the use of the germanium, thereby avoiding a problem of MOS gate oxide. A bulk germanium wafer is heavier than the silicon, and is fragile. The GOI can help to overcome these problems, and makes a germanium metal-oxide-semiconductor field effect transistor (MOSFET) technology be compatible with a silicon processing apparatus. An epitaxy method applied to a germanium donor can easily change the germanium donor to 300 mm in an equal ratio, but higher crystal defects. The germanium surface processing is a quite difficult task, for the reason that a typical silicon cleaning solution may corrode the surface of the germanium, making a rough surface. Although it has been confirmed that a silicon processing apparatus can be used to process the GOI and a 0.15-micron device has already been made successfully, an $I_{on}/I_{off}$ ratio of the MOSFET is undesirable and the mobility also needs to be further improved. The quality of the MOSFET on the germanium surface is quite a problem. Besides that, due to the small forbidden band gap (0.66 eV) of the germanium, the germanium device undergoes a fatal defect of large leakage current which also seriously hinders a wider application of a germanium MOS device, so that the GOI technology should solve impacts of a leakage of narrow band gap bond of germanium and band-to-band tuning. Like the SOI which solves many shortages of bulk silicon in a semiconductor device, the GOI, as a candidate material, is also a good solution to the defects of Ge materials. In order to get low leakage current and the MOS device with better performance, the GOI has been brought into focus. Some research structures and companies have prepared out a GOI structure by using many methods, for example, the Big Three, Soitec, IMEC, and Umicore, in the European semiconductor field announce a joint development of the GOI technology. Umicore focuses on research and development of 8 and 12-inch single crystal Ge chips, Soitec researches and develops the GOI chip by using a SMART CUT technique, and IMEC focuses on the research of the preparation of the high-performance CMOS circuit applied to a process of 45 nanometers or below by a Ge-based technique. Silicon Genesis also announces that they are working on the research and production of the GOI wafer, IBM announces the development of a high-speed photodetector based on a newly developed GOI technology, in which the method for manufacturing the GOI of Silicon Genesis and IBM is: growing the germanium directly on a quite thin SOI. However, currently, they all have some imitations on their own. The Ge condensation technology is one of the most promising technology. The previous Ge condensation technology used epitaxial SiGe on the SOI substrate, which may introduce a high dislocation density ($\geq 10^7$), seriously affecting the final quality of the GOI and the performance of the later device. From the formation mechanism of a threading dislocation, at the beginning of the concentration, a misfit dislocation of a SiGe/Si interface descends to a SiGe on insulator (SGOI)/buried oxide (BOX) interface, and then after the further concentration, the misfit dislocation threads upwards, forming the threading dislocation.

In view of this, how to propose a preparation method having an easy technique and capable of reducing a GOI threading dislocation destiny has become a problem to be solved currently.

SUMMARY OF THE PRESENT INVENTION

In view of the above defects of the prior art, an objective of the present invention is to provide a method for preparing a GOI chip structure, used for solving the problem of complex technique and large dislocation density in a GOI chip in the prior art.

In order to realize the aforementioned objective and other related objectives, the present invention provides a method for preparing a GOI chip structure, at least comprising the following steps:

1): preparing an SGOI structure by using a SMART CUT technique;

2): performing germanium condensation technology on the SGOI structure, so as to form a stacked structure, sequentially comprising a second Si substrate, an insulating buried layer BOX, a Ge layer, and a $SiO_2$ layer; and 3): etching off the SiO$_2$ layer on a surface of the stacked structure to obtain a GOI structure.

Optionally, step 1) can further comprise:

1-1): providing a first Si substrate, and growing one epitaxial SiGe layer on the first Si substrate;

1-2): performing H$^+$ ion implantation on a surface of the SiGe layer by using an ion implantation technique, and controlling ion implanting energy to form one silicon layer rich in H$^+$ ions as a cutting layer at a preset depth in the first Si substrate;

1-3): providing the second Si substrate and preparing oxide layer on the second Si substrate;

1-4): bonding the surface of the SiGe layer on the first Si substrate to a surface of the SiO$_2$ layer on the second Si substrate by using a bonding technique to form a stacked structure, sequentially comprising the second Si substrate, the oxide layer BOX, the SiGe layer, and the first Si substrate;

1-5): performing high-temperature annealing treatment on the bonded structure, so as to cut off a part of the first Si substrate from the cutting layer; and 1-6): etching off all of the rest first Si substrate by using a Tetramethylammonium hydroxide (TMAH) corrosive solution to obtain the SGOI structure.

Optionally, a thickness of the epitaxial SiGe layer grown in step 1-1) is from 80 nm to 120 nm, and a component of Ge in the SiGe layer is from 5% to 30%.

Optionally, the ion implanting energy in step 1-2) is 60 Kev, and a dosage of the implanted H$^+$ ions is 6.0E16. Further optionally, the depth of the H$^+$ ion implantation in the first Si substrate is from 600 nm to 700 nm.

Optionally, a material of the insulating buried layer BOX prepared on the second Si substrate in step 1-3) is SiO$_2$ or Al$_2$O$_3$. Further optionally, a thickness of the insulating buried layer BOX is from 100 nm to 150 nm.

Optionally, conditions of the technique of cutting off a part of the first Si substrate in step 1-5) are: first, heating up temperature to 300° C. in half an hour, keeping the temperature for three hours, and then, heating up the temperature to 600° C. in half an hour and keeping the temperature for half an hour, in which 8000 ccm of high-purity O$_2$ is input in the whole process.

Optionally, a thickness of the Ge layer formed after the germanium condensation technology in step 2) is from 7 nm to 50 nm.

Optionally, step 2) can further comprise:

2-1): putting the SGOI structure into a reaction furnace of 600° C., at the same time inputting 5000 ccm of N$_2$ as a protective atmosphere, heating up the reaction furnace at a rate of 10° C. per minute, and stopping inputting N$_2$ when the reaction furnace is heated up to 1050° C.;

2-2): inputting 4000 ccm of O$_2$ for 30 minutes, and then stopping the inputting;

2-3): inputting 5000 ccm of N$_2$ for 30 minutes, and then stopping the inputting;

2-4): repeating step 2-2) and step 2-3) 4 times, reducing the temperature of the reaction furnace from 1050° C. to 900° C. within an hour under the atmosphere of N$_2$;

2-5): inputting 4000 ccm of O$_2$ for 30 minutes, and then stopping the inputting;

2-6): inputting 5000 ccm of N$_2$ for 30 minutes, and then stopping the inputting; and 2-7): repeating step 2-5) and step 2-6) 4 times, reducing the temperature of the reaction furnace from 900° C. to 600° C. within an hour under the atmosphere of N$_2$, implementing the germanium concentration to form the stacked structure, sequentially comprising the second Si substrate, the insulating buried layer BOX, the Ge layer, and the SiO$_2$ layer.

As described above, the method for preparing a GOI chip structure of the present invention has the following benefits.

In the present invention, first, the SGOI chip structure is made out by using the SMART CUT technique, and then, the germanium concentration is performed on the SGOI chip structure, so as to obtain the GOI chip structure. Because the SGOI made by using the SMART CUT technology basically has no misfit dislocation in an SGOI/BOX interface, the threading dislocation density of the GOI is finally reduced. A technique of the present invention is simple, the high-quality GOI chip structure can be implemented, and the germanium condensation technology is greatly improved. An ion implantation technology and an annealing technology are quite mature techniques in the current semiconductor industry, so that such a preparation method greatly improves the possibility of wide use of the germanium condensation technology in the semiconductor industry.

DESCRIPTION OF NUMERALS

Figure 1A:
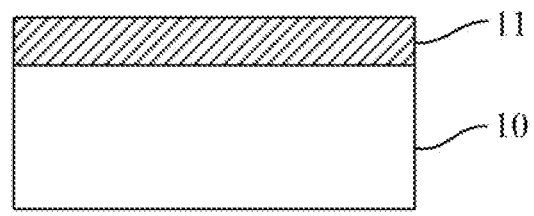
FIGS. 1a to 1f are flow charts of a technique of preparing an SGOI structure by using a SMART CUT technology in the present invention.

10 First Si substrate
100 Cutting layer
11 SiGe layer
110 SiO$_2$ layer
20 Second Si substrate
21 Insulating buried layer BOX

DETAILED DESCRIPTION OF THE PREFERRED EMBODIMENTS

Implementations of the present invention are described through the specific embodiments below. According to the content disclosed by the specification, persons skilled in the art can easily understand other advantages and effects of the present invention. The present invention can also be implemented or applied through other different specific embodiments. Based on different views and applications, modifications or changes can be made for the details of the specification without departing from the spirit of the present invention.

Referring to FIG. 1a to FIG. 1f, and FIG. 2 to FIG. 3, it should be noted that, only the basic idea of the present invention is schematically illustrated by the drawings provided in this embodiment, so that the drawings merely show the components relevant to the present invention, and are not drawn according to the number, the shapes, and the sizes of the components in actual implementations; the shapes, the number and the ratio of the components in the actual implementations of the present invention can be randomly changed, and the layouts of the components can also be more complex.

As shown in the diagram, the present invention provides a method for preparing a GOI chip structure, at least including the following steps.

First, referring to FIG. 1a to FIG. 1f, an SGOI chip structure is prepared out by using a SMART CUT technology, in which the process includes the following steps.

Step one: as shown in FIG. 1a, a first Si substrate 10 is provided, an epitaxial SiGe layer 11 is grown on the first Si substrate 10, in which a thickness of the SiGe layer 11 is from 80 nm to 120 nm; in this embodiment, the thickness of the SiGe layer 11 is selected as 100 nm, but is not limited herein, in other embodiments, the thickness of the SiGe layer 11 can be adjusted according to the need. In addition, content of Ge in the SiGe layer 11 is from 5% to 30%; in this embodiment, the content of Ge is temporally selected as 30%, but is not limited herein. It is hereby declared that, in other embodiments, the content of Ge can be adjusted according to the need.

Figure 1B:
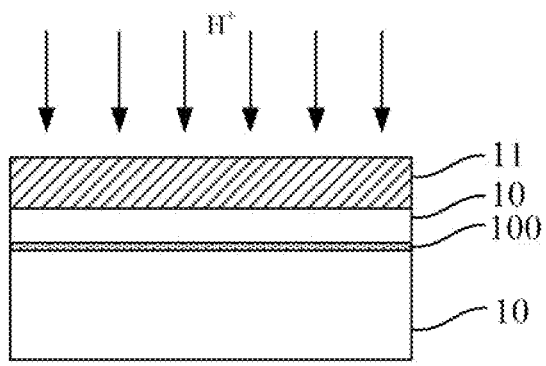

Step two: as shown in FIG. 1b, $H^+$ ion implantation is performed on a surface of the SiGe layer 11 by using an ion implantation technique, and ion implanting energy is controlled to form one silicon layer rich in $H^+$ ions as a cutting layer 100 at a preset depth in the first Si substrate 10, in which the larger the $H^+$ ion implanting energy is, the deeper an $H^+$ implantation peek is. Generally, when the ion implanting energy is from 50 Kev to 150 Kev, the depth of the implantation in the Si wafer is correspondingly distributed in 500 nm to 1200 nm. In this embodiment, the ion implanting energy is 60 Kev, the depth of the implantation from the surface of the SiGe layer 11 is 700 nm to 800 nm. Because the thickness of the SiGe layer 11 is 100 nm, the depth of the $H^+$ ion implantation in the first Si substrate 10 is 600 nm to 700 nm, but is not limited herein. In other embodiments, different ion implanting energies can be selected according to the need to reach different implantation depths.

Figure 1C:
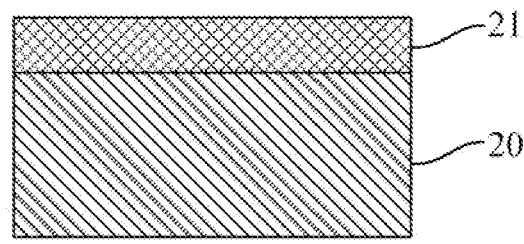

Step three: As shown in FIG. 1c, a second Si substrate 20 is provided, and an insulating buried layer BOX 12 with a thickness of 100 nm to 150 nm is grown on the second Si substrate 20 through thermal oxidation, in which the thickness of the insulating buried layer BOX 12 is selected as 120 nm in this embodiment. It should be noted that, a material of the insulating buried layer in this embodiment is temporally selected as $SiO_2$, but is not limited herein. It is hereby declared that, in other embodiments, the material can also be $Al_2O_3$.

Figure 1D:
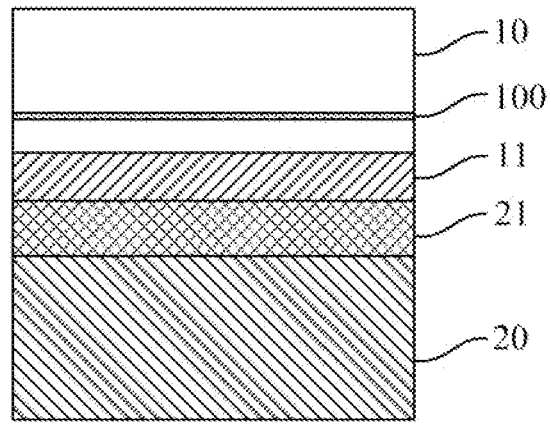

Step four: as shown in FIG. 1d, after a surface of the SiGe layer 11 on the first Si substrate 10 and a surface of the insulating buried layer BOX 21 on the second Si substrate 20 are seriously cleaned, activated, and polished, the two polished surfaces together are adhered at room temperature, so as to bond two silicon wafers together, and form a stacked structure sequentially including the second Si substrate 20, the insulating buried layer BOX 21, the SiGe layer 11, and the first Si substrate 10, in which the insulating buried layer BOX 21 is used as the insulating buried layer in the finally formed structure.

Figure 1E:
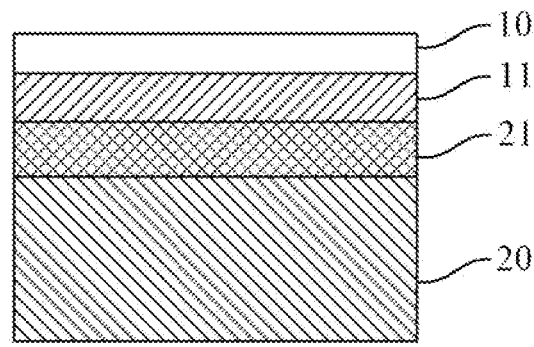

Step five: As shown in FIG. 1e, annealing treatment is performed on the bonded structure. Generally, there are two steps: first, a cutting layer 100 of a high-concentration of $H^+$ ions which is implanted into the first Si substrate can be nucleated and form bubbles, rapid exploration of the bubbles cuts off the silicon wafer from the cutting layer 100 of the high-concentration of $H^+$ ions, which is the cutting; secondly, the bonding strength of the bonding interfaces are increased by high-temperature heat treatment, and ion implantation damage in the bonded structure is eliminated. Specific technique conditions in this embodiment are: first, heating up temperature to 300 in three hours keeping the temperature for three hours; heating up the temperature to 600° C. in half an hour and keeping the temperature for half an hour to increase the bonding strength of the bonding interfaces, in which 8000 ccm of high-purity $O_2$ is input in the whole process.

Figure 1F:
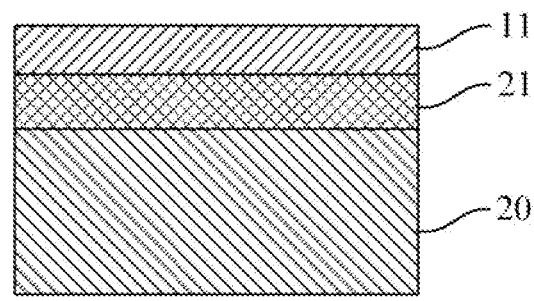

Step six: As shown in FIG. 1f, all of the rest first Si substrate 10 is corroded off by using a TMAH corrosive solution to obtain the SGOI structure, in which the full name of TMAH is tetramethylammonium hydroxide, which is an anisotropic corrodent of good corrosivity and good selectivity, non-toxic and does not pollute the environment. It is the most important thing that, the TMAH is compatible with CMOS technique, and is in accordance with a developing trend of silicon on chip (SOC), so that TMAH is gradually replacing KOH and other corrosive solutions, and 10% and 25% aqueous solutions of the TMAH are generally used in the technique. Therefore, in the present invention, the TMAH solution is used for a better control of the corrosion of the first Si substrate 10, so as to obtain a high-quality SGOI structure.

Figure 2:
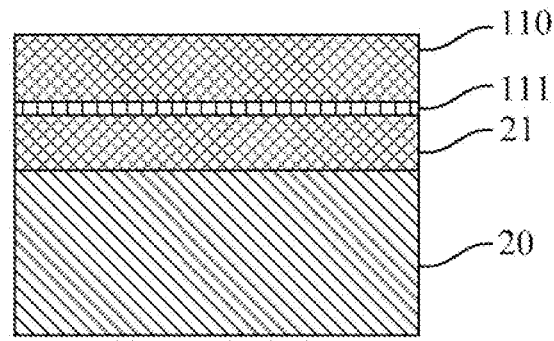
FIG. 2 is a schematic structural diagram after germanium concentration is performed in the present invention.

Then, as shown in FIG. 2, germanium concentration is performed on the SGOI chip structure, so as to form a stacked structure, sequentially including the second Si substrate 20, the insulating buried layer BOX 21, the Ge layer 11, and the $SiO_2$ layer 110. The specific process is: the thermal oxidation is performed on the SiGe layer 11 in the SGOI chip structure under an atmosphere of $O_2$, and the temperature of the thermal oxidation is lower than a melting point of the SiGe, and the melting point of the SiGe changes with different components of Ge. In this embodiment, the component of Ge in the SiGe layer 11 is 30%, the melting point of $Si_{0.7}Ge_{0.3}$ is lower than 1050° C., so that in the thermal oxidation process, a Si atom of the SiGe layer 11 preferentially combines with $O_2$ to generate $SiO_2$, so that the component of the Ge atom is gradually increased while the component of the Si atom is gradually decreased, more and more Ge atoms are separated out and the separated Ge atoms are restrained between the $SiO_2$ layer 110 generated above the Ge atoms and the buried layer oxidation 21 below, and a pure Ge layer 111 is finally formed. The thickness of the pure Ge layer 111 formed in this embodiment is preferentially 30 nm, and the thickness of the $SiO_2$ layer 110 finally formed on the surface of the pure Ge layer 111 is 160 nm, but is not limited herein. In other embodiments, the pure Ge layer 111 having an adjustable thickness of 7 nm to 50 nm can also be obtained by adjusting the thickness of the SiGe layer 11 and the component of Ge in the SiGe. In this embodiment, the specific technique conditions of performing the germanium concentration and an operation process include the following steps:

1) putting the SGOI structure into a reaction furnace of 600° C., and then inputting 5000 ccm of $N_2$ as a protective atmosphere, heating up the reaction furnace at a rate of 10° C. per minute, and stopping inputting $N_2$ when the reaction furnace is heated up to 1050° C.;

2) inputting 4000 ccm of $O_2$ for 30 minutes, and then stopping the inputting;

3) inputting 5000 ccm of $N_2$ for 30 minutes, and then stopping the inputting;

4) after repeating step 2) and step 3) 4 times, reducing the temperature of the reaction furnace from 1050° C. to 900° C. within an hour under the atmosphere of $N_2$;

5) inputting 4000 ccm of $O_2$ for 30 minutes, and then stopping the inputting;

6) inputting 5000 ccm of $N_2$ for 30 minutes, and then stopping the inputting; and 7) after repeating step 5) and step 6) 5 times, reducing the temperature of the reaction furnace from 900° C. to 600° C. within an hour under the atmosphere of $N_2$ to finish the germanium concentration.

It should be noted that, in the technique of germanium condensation technology, the thermal oxidation reactions are respectively performed at the temperature of 1050° C. and 900° C. It is because that, after the thermal oxidation reaction is performed at the temperature of 1050° C., the component of Ge in SiGe layer 11 is increased, resulting in lowering of the melting point of the SiGe. Therefore, after a period of time, the thermal oxidation reaction needs to be further performed at a lower temperature, that is, 900° C., so as to increase the purity of the germanium layer after the germanium concentration.

It should be further noted that, in the above germanium concentration, the inputting of $N_2$ has two functions: one is to be used as the protective atmosphere, and the other is to make components in the SiGe layer or the Ge layer after the concentration to be uniform. Because an area close to the surface preferentially reacts with $O_2$, and the content of Ge in the area is higher than that of the lower layer, forming a gradient in the SiGe which is not conductive to forming the pure germanium by concentrating finally.

In this embodiment, the technique conditions of the germanium concentration are merely applicable when the component of Ge in the SiGe layer 11 is 30% and the thickness of the SiGe layer 11 is 100 nm. However, the technique conditions of the germanium concentration are not limited herein. In other embodiments, with the changes of the thickness of the SiGe layer 11 and the component of Ge in the SiGe, the technique conditions also change.

Figure 3:
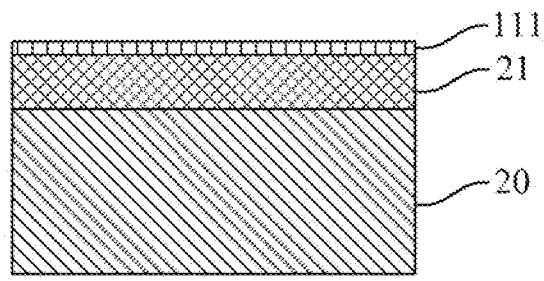
FIG. 3 is a schematic structural diagram of a final GOI structure prepared in the present invention.

Finally, after the germanium concentration is performed, the $SiO_2$ layer 110 on the surface of the generated pure Ge layer 111 is corroded off, so as to obtain the GOI structure. The finally formed GOI structure is shown in FIG. 3.

To sum up, the present invention provides a method for preparing a GOI chip structure. In the method, first, the SGOI chip structure is made out by using the SMART CUT technique, and then, germanium condensation technology is performed on the SGOI chip structure, so as to obtain the GOI chip structure. Because the SGOI made by using the SMART CUT technology basically has no misfit dislocation in an SGOI/BOX interface, a threading dislocation of the GOI is finally reduced. A technique of the present invention is simple, the high-quality GOI chip structure can be implemented, and germanium condensation technology is greatly improved. An ion implantation technology and an annealing technology are quite mature techniques in the current semiconductor industry, so that such a preparation method greatly improves the possibility of wide use of the germanium concentration in the semiconductor industry. Therefore, the present invention effectively overcomes shortages of the prior art, and has a high industrial use value.

The theory and effects of the present invention are described by the exemplary embodiments above, which are not used to limit the present invention. Persons skilled in the art can make modifications to and changes of the above embodiments without departing from the spirit and scope of the present invention. Therefore, any equivalent modification or changes made by persons skilled in the art without departing from the spirit and technical idea disclosed by the present invention is also intended to be included within the claims of the present invention.

What is claimed is:

1. A method for preparing a germanium-on-insulator (GOI) chip structure, at least comprising the following steps:
   1) preparing a SiGe on insulator (SGOI) structure by using a SMART CUT technique;
   2) performing germanium concentration on the SGOI structure, so as to form a stacked structure, sequentially comprising a second Si substrate, an insulating buried layer BOX, a Ge layer, and a $SiO_2$ layer; and
   2-1) putting the SGOI structure into a reaction furnace of 600° C., and then inputting 5000 ccm of $N_2$ as a protective atmosphere, heating up the reaction furnace at a rate of 10° C. per minute, and stopping inputting $N_2$ when the reaction furnace is heated up to 1050° C.;
   2-2) inputting 4000 ccm of $O_2$ for 30 minutes, and then stopping the inputting;
   2-3) inputting 5000 ccm of $N_2$ for 30 minutes, and then stopping the inputting;
   2-4) sequentially repeating step 2-2) and step 2-3) 4 times, reducing the temperature of the reaction furnace from 1050° C. to 900° C. within an hour under the atmosphere of $N_2$;
   2-5) inputting 4000 ccm of $O_2$ for 30 minutes, and then stopping the inputting;
   2-6) inputting 5000 ccm of $N_2$ for 30 minutes, and then stopping the inputting; and
   2-7) sequentially repeating step 2-5) and step 2-6) 4 times, reducing the temperature of the reaction furnace from 900° C. to 600° C. within an hour under the atmosphere of $N_2$, implementing the germanium concentration to form the stacked structure, sequentially comprising the second Si substrate, the insulating buried layer BOX, the Ge layer, and the $SiO_2$ layer
   3) etching off the $SiO_2$ layer on a surface of the stacked structure to obtain a GOI structure.

2. The method for preparing a GOI chip structure as in claim 1, wherein a thickness of the Ge layer formed after the germanium concentration technique in step 2) is from 7 nm to 50 nm.

3. The method for preparing a GOI chip structure as in claim 1, wherein step 1) further comprises:
   1-1) providing a first Si substrate, and growing one epitaxial SiGe layer on the first Si substrate;
   1-2) performing $H^+$ ion implantation on a surface of the SiGe layer by using an ion implantation technique, and controlling ion implanting energy to form one silicon layer rich in $H^+$ ions as a cutting layer at a preset depth in the first Si substrate;
   1-3) providing the second Si substrate and preparing one insulating buried layer BOX on the second Si substrate;
   1-4) bonding the surface of the SiGe layer on the first Si substrate to a surface of the insulating buried layer BOX layer on the second Si substrate by using a bonding technique to form a stacked structure, sequentially comprising the second Si substrate, the insulating buried layer BOX, the SiGe layer, and the first Si substrate;
   1-5) performing high-temperature annealing treatment on the bonded structure, so as to cut off a part of the first Si substrate from the cutting layer; and
   1-6) etching off all of the rest first Si substrate by using a Tetramethylammonium hydroxide (TMAH) corrosive solution to obtain the SGOI structure.

4. The method for preparing a GOI chip structure as in claim 3, wherein conditions of the technique of cutting off a part of the first Si substrate in step 1-5) are: first, heating up temperature to 300° C., keeping the temperature for three hours, and then, heating up the temperature to 600° C. in half an hour and keeping the temperature for half an hour, wherein 8000 ccm of high-purity O2 is input in the whole process.

5. The method for preparing a GOI chip structure as in claim 3, wherein a thickness of the epitaxial SiGe layer grown in step 1-1) is from 80 nm to 120 nm.

6. The method for preparing a GOI chip structure as in claim 3, wherein component of Ge in the SiGe layer in step 1-1) is from 12% to 30%.

7. The method for preparing a GOI chip structure as in claim 3, wherein the ion implanting energy in step 1-2) is 60 Kev, and a dosage of the implanted $H^+$ ions is 6.0E16.

8. The method for preparing a GOI chip structure as in claim 7, wherein the depth of the $H^+$ ion implantation in the first Si substrate is from 600 nm to 700 nm.

9. The method for preparing a GOI chip structure as in claim 3, wherein a material of the insulating buried layer BOX prepared on the second Si substrate in step 1-3) is $SiO_2$ or $Al_2O_3$.

10. The method for preparing a GOI chip structure as in claim 9, wherein a thickness of the insulating buried layer BOX is from 100 nm to 150 nm.

* * * * *